United States Patent
Lee et al.

(10) Patent No.: US 9,466,642 B2
(45) Date of Patent: Oct. 11, 2016

(54) LIGHT EMITTING DIODE HAVING MULTI-JUNCTION STRUCTURE AND METHOD OF FABRICATING THE SAME

(71) Applicant: GWANGJU INSTITUTE OF SCIENCE AND TECHNOLOGY, Gwangju (KR)

(72) Inventors: Dong-Seon Lee, Gwangju (KR); Dukjo Kong, Gwangju (KR); Chang Mo Kang, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 0 days.

(21) Appl. No.: 14/340,940

(22) Filed: Jul. 25, 2014

(65) Prior Publication Data

US 2015/0028356 A1    Jan. 29, 2015

(30) Foreign Application Priority Data

Jul. 29, 2013  (KR) .......................... 10-2013-0089287

(51) Int. Cl.
*H01L 27/15* (2006.01)
*H01L 33/44* (2010.01)

(52) U.S. Cl.
CPC .............. *H01L 27/15* (2013.01); *H01L 27/153* (2013.01); *H01L 33/44* (2013.01)

(58) Field of Classification Search
CPC ... H01L 33/32; H01L 33/20; H01L 33/0079; H01L 33/38; B82Y 20/00
See application file for complete search history.

(56) References Cited

U.S. PATENT DOCUMENTS

2011/0210362 A1*  9/2011  Lee et al. ........................ 257/98

FOREIGN PATENT DOCUMENTS

| KR | 100470904 B1 * | 3/2005 | ............. H01L 33/00 |
| KR | 20130027302 A * | 3/2013 | ............. H01L 33/26 |

OTHER PUBLICATIONS

Machine translation of KR 10-2013-0027302 A.*
Machine translation of KR 10-0470904 B1.*

* cited by examiner

*Primary Examiner* — Michelle Mandala
(74) *Attorney, Agent, or Firm* — Hauptman Ham, LLP

(57) ABSTRACT

Disclosed herein is a light emitting diode having a multi-junction structure and a method of fabricating the same. In the light emitting diode, each light emitting structure has a column shape and includes two light emitting layers centered on a p-type semiconductor layer. In addition, a p-type electrode is formed on a side surface of the p-type semiconductor layer, and a p-type electrode is formed through formation and removal of a sacrificial layer. Through this process, the p-type electrode can be formed as a side electrode.

6 Claims, 8 Drawing Sheets

LIGHT EMITTING DIODE HAVING MULTI-JUNCTION STRUCTURE AND METHOD OF FABRICATING THE SAME

CROSS REFERENCE TO RELATED APPLICATION

This application claims the benefit of Korean Patent Application No. 10-2013-0089287, filed on Jul. 29, 2013, entitled "LIGHT EMITTING DIODE HAVING MULTI-JUNCTION STRUCTURE AND METHOD OF FABRICATING THE SAME", which is hereby incorporated by reference in its entirety into this application.

BACKGROUND

1. Technical Field

The present invention relates to a structure of a light emitting diode and a method of fabricating the same, and more particularly, to a light emitting diode, which includes a plurality of light emitting bodies each having a column shape and a multi-junction structure, and an electrode structure electrically connecting the light emitting bodies to each other, and a method of fabricating the same.

2. Description of the Related Art

A light emitting diode is an electronic device that generates light through recombination of holes supplied from a p-type semiconductor layer and electrons supplied from an n-type semiconductor layer. In order to realize desired brightness and light emission through recombination of electrons and holes, the light emitting diode requires a quantum confinement effect. To obtain the quantum confinement effect, a multi-quantum well structure is formed in a light emitting layer which performs light emission. The multi-quantum well structure includes barrier layers and well layers that are alternately stacked one above another.

Recently, with the development of processing techniques, gallium nitride-based light emitting diodes provide high brightness and various products are being developed based on various chip types. For example, a normal light emitting diode has a structure in which an n-type semiconductor layer is partially exposed by partially etching a p-type semiconductor layer and a light emitting layer on the n-type semiconductor layer. Electrode layers are formed on the exposed p-type semiconductor layer and the n-type semiconductor layer. In addition, a flip-chip type light emitting diode is configured to emit light in the direction of a substrate. Further, a vertical type light emitting diode requires a process of separating a substrate.

In addition, when a luminaire is implemented using light emitting diodes, plural light emitting diodes are connected to each other in series to secure high brightness, and an to alternating power source can be directly used.

Further, studies have been continued to secure linearity of light in a packaging process while enabling efficient discharge of light through arrangement of electrodes in fabrication of light emitting diodes for illumination.

The light emitting diodes for illumination are individually fabricated and connected to each other in series in a packaging process. Thus, it is necessary to perform individual examination of light emitting diode chips in the packaging process, and a process for mounting and wiring the light emitting diode chips on a lead frame or a separate substrate is performed. As a result, there are problems of an excess of fabrication processes and fabrication costs.

Therefore, there is still a need for generation of various colors in a single luminous structure or for realization of high brightness.

BRIEF SUMMARY

It is one aspect of the present invention to provide a light emitting diode which can realize a multi-junction structure and high brightness by electrically connecting the multi-junction structure.

It is another aspect of the present invention to provide a method of fabricating a light emitting diode capable of realizing the multi junction structure and high brightness.

In accordance with one aspect of the present invention, a light emitting diode includes: a light emitting structure formed on a substrate and including a first n-type semiconductor layer, a first light emitting layer, a p-type semiconductor layer, a second light emitting layer and a second n-type semiconductor layer; a first n-type electrode adjoining the first n-type semiconductor layer at a lower portion of the light emitting structure; a second n-type electrode adjoining the second n-type semiconductor layer at an upper portion of the light emitting structure; and a p-type electrode adjoining a side surface of the p-type semiconductor layer of the light emitting structure.

In accordance with another aspect of the present invention, a method of fabricating a light emitting diode includes: sequentially forming a first n-type to semiconductor layer, a first light emitting layer, a p-type semiconductor layer, a second light emitting layer and an second n-type semiconductor layer on a substrate; forming light emitting structures by etching the second n-type semiconductor layer, the second light emitting layer, the p-type semiconductor layer, the first light emitting layer and the first n-type semiconductor layer; forming a first passivation layer such that a space between the light emitting structures is filled with the first passivation layer, followed by forming a p-type electrode adjoining a side surface of the p-type semiconductor layer; and forming a second passivation layer on the p-type electrode, and forming a second n-type electrode electrically connected to the second n-type semiconductor layer on the second passivation layer.

According to the present invention, the multi-junction structure includes two light emitting layers at upper and lower portions of the p-type semiconductor layer, respectively. In addition, the light emitting structures have the same shape and the p-type common electrode is formed as a common electrode on the side surface of the p-type semiconductor layer. Thus, the plural light emitting structures are connected to each other in parallel by the common electrode, and each of the light emitting structures also has two light emitting layers connected to each other in parallel. Thus, the light emitting diode according to this invention secures high brightness and can realize light of various colors depending upon the process of forming the light emitting layers.

BRIEF DESCRIPTION OF THE DRAWINGS

The above and other aspects, features, and advantages of the present invention will become apparent from the detailed description of the following embodiments in conjunction with the accompanying drawings.

DETAILED DESCRIPTION

Figure 1:
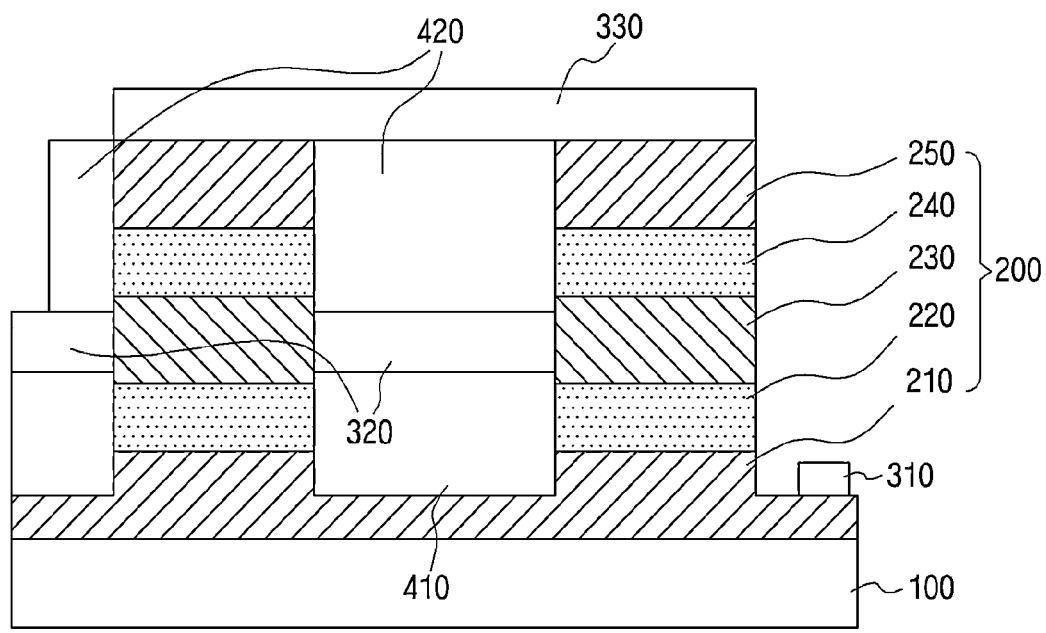
FIG. 1 is a sectional view of a light emitting diode according to one exemplary embodiment of the present invention.

Hereinafter, exemplary embodiments of the present invention will be described in detail with reference to the accompanying drawings. It should be understood that the present invention is not limited to the following embodiments and may be embodied in different ways, and that the embodiments are given to provide complete disclosure of the invention and to provide thorough understanding of the invention to those skilled in the art. The scope of the invention is limited only by the accompanying claims and equivalents thereof. Like components will be denoted by like reference numerals throughout the specification.

Unless otherwise defined herein, all terms including technical or scientific terms used herein have the same meanings as commonly understood by those skilled in the art to which the present invention pertains. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein.

FIG. 1 is a sectional view of a light emitting diode according to one exemplary embodiment of the present invention.

Referring to FIG. 1, a light emitting diode according to one exemplary embodiment of the invention includes a plurality of light emitting structures 200 formed on a substrate 100. Each of the light emitting structures 200 includes a first n-type semiconductor layer 210, a first light emitting layer 220, a p-type semiconductor layer 230, a second light emitting layer 240, and a second n-type semiconductor layer 250. In addition, each of the light emitting structures 200 is connected to electrodes 310, 320, 330. The electrodes include a first n-type electrode 310, a p-type electrode 320, and a second n-type electrode 330. The first n-type electrode 310 is electrically connected to the first n-type semiconductor layer 210, the p-type electrode 320 is electrically connected to the p-type semiconductor layer 230, and the second n-type electrode 330 is electrically connected to the second n-type semiconductor layer 250. Particularly, the p-type electrode 320 is formed in a space between the light emitting structures 200 and adjoins a side surface of the p-type semiconductor layer 230.

The first n-type semiconductor layer 210 is formed on the substrate 100. The substrate 100 may be formed of a material selected depending upon the material of the first n-type semiconductor layer 210. For example, when the first n-type semiconductor layer 210 is composed of gallium nitride, the substrate 100 may be composed of sapphire, gallium nitride, or zinc oxide. In addition, a buffer layer may be further provided between the substrate 100 and the first n-type semiconductor layer 210 to relieve crystal defects of the first n-type semiconductor layer 210, which can be caused by lattice mismatch between the substrate 100 and the first n-type semiconductor layer 210. The first n-type semiconductor layer 210 is doped with a donor. The kind of donor to be doped is determined according to the material of the first n-type semiconductor layer 210. For example, when the first n-type semiconductor layer 210 is composed of gallium nitride, the donor is preferably silicon.

The first light emitting layer 220 is formed on the first n-type semiconductor layer 210. Preferably, the first light emitting layer 220 has a structure in which barrier layers and well layers are alternately stacked one above another. When the first n-type semiconductor layer 210 is composed of gallium nitride, the barrier layers may be composed of gallium nitride. In addition, the barrier layers and the well layers may further include indium for band gap control. For example, a fraction of indium in the barrier layers may be lower than the fraction of indium in the well layers. In some embodiments, the barrier layers may be formed only of gallium nitride and may have a lower fraction of indium than the barrier layers.

The p-type semiconductor layer 230 is formed on the first light emitting layer 220. The p-type semiconductor layer 230 is doped with an acceptor. The kind of acceptor to be doped is determined according to the material of the p-type semiconductor layer 230. For example, when the p-type semiconductor layer 230 is composed of gallium nitride, the acceptor may be selected from among group II elements.

The second light emitting layer 240 is formed on the p-type semiconductor layer 230. The second light emitting layer 240 may have a structure in which barrier layers and well layers are alternately stacked one above another, and may have the same structure as that of the first n-type semiconductor layer 210. Further, in some embodiments, the second light emitting layer 240 may be subjected to different band-gap control from that of the first light emitting layer 220. For example, depending upon the content of indium, the first light emitting layer 220 may produce light of a first color and the second light emitting layer 240 may produce light of a second color, which is different from the first color. The second n-type semiconductor layer 250 is formed on the second light emitting layer 240. The second n-type semiconductor layer 250 may have the same composition as that of the first n-type semiconductor layer 210.

The first n-type electrode 310 is formed on an upper surface or a side surface of the first n-type semiconductor layer 210. In addition, a first passivation layer 410 is formed on an upper surface of the first n-type electrode 310, and the p-type electrode 320 is formed on an upper surface of the first passivation layer 410 and on a side surface of the p-type semiconductor layer 230. Further, a second passivation layer 420 is formed on an upper surface of the p-type electrode 320, and the second n-type electrode 330 is formed on an upper surface of the second passivation layer 420 or on a side surface of the second n-type semiconductor layer 250. Further, in some embodiments, when the second n-type electrode 330 is formed on the side surface of the second n-type semiconductor layer 250, it is desirable that an uppermost surface of the second passivation layer 420 not be placed above the surface of the second n-type semiconductor layer 250.

The first n-type electrode 310 and the second n-type electrode 330 may be formed in various patterns depending upon a discharge direction of light generated in the light emitting layers 220, 240.

For example, when light generated in the light emitting layers 220, 240 is discharged in an upward direction, the second n-type electrode 330 may be formed in a fine pattern in order to allow efficient discharge of light. In addition, when light generated in the light emitting layers 220, 240 is discharged downwards in the direction of the substrate 100, the second n-type electrode 330 is deposited on the overall surface of the second n-type semiconductor layer 250, the first n-type electrode 310 may be provided in a patterned shape on the side surface of the first n-type electrode 310.

Further, when light generated in the light emitting layers 220, 240 is discharged in the upward and downward directions, the first n-type electrode 310 and the second n-type electrode 330 may be provided in a patterned shape.

Further, the first passivation layer 410 and the second passivation layer 420 may have lower indices of refraction than those of the first n-type semiconductor layer 210, the first light emitting layer 220, the p-type semiconductor layer 230, the second light emitting layer 240 and the second n-type semiconductor layer 250. With this structure, the light emitting diode allows efficient reflection of light entering the first passivation layer 410 and the second passivation layer 420.

In FIG. 1, the first n-type semiconductor layers 210 of the respective light emitting structures 200 are electrically connected to each other. Thus, the first n-type electrode 310 is electrically connected to the first n-type semiconductor layer 210 of each of the light emitting structures 200.

Further, the p-type electrode 320 formed on the first passivation layer 410 adjoins the side surface of the p-type semiconductor layer 220. Further, the second n-type electrode 330 is electrically connected to the second n-type semiconductor layer 250. Thus, in the structure of FIG. 1, the plural light emitting structures 200 are connected to each other in parallel in the directions of the n-type electrodes 310, 330 centered on the p-type electrode 320.

Figure 2:
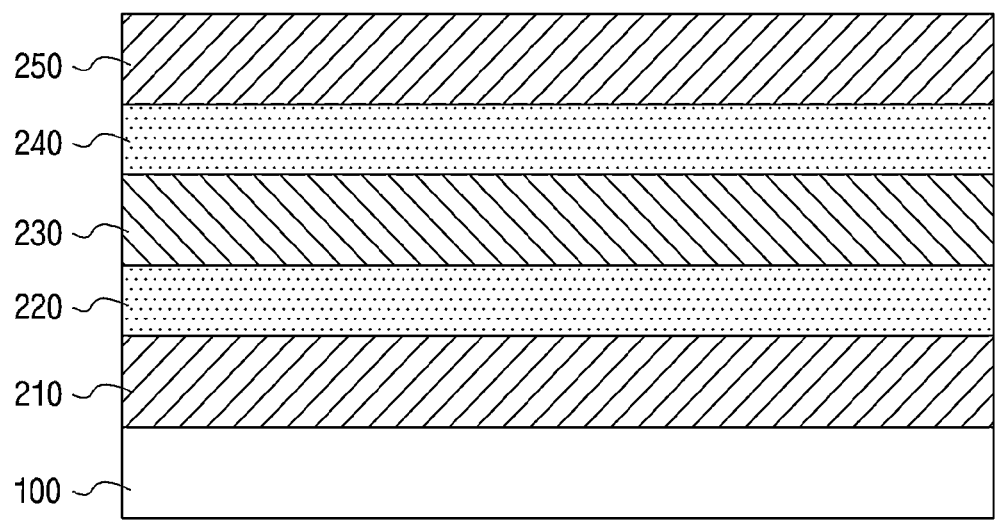
FIG. 2 to FIG. 8 are sectional views illustrating a method of fabricating the light emitting diode of FIG. 1 according to one exemplary embodiment of the present invention.

FIG. 2 to FIG. 8 are sectional views illustrating a method of fabricating the light emitting diode of FIG. 1 according to one exemplary embodiment of the present invention. Referring to FIG. 2, a first n-type semiconductor layer 210, a first light emitting layer 220, a p-type semiconductor layer 230, a second light emitting layer 240 and a second n-type semiconductor layer 250 are sequentially formed on a substrate 100. Each of these layers may be formed by metal organic chemical vapor deposition (MOCVD). In addition, each of these layers may include gallium nitride. When the layers are formed of gallium nitride, a sapphire substrate may be used as the substrate 100. In addition, a buffer layer may be interposed between the substrate 100 and the first n-type semiconductor layer 210.

Figure 3:
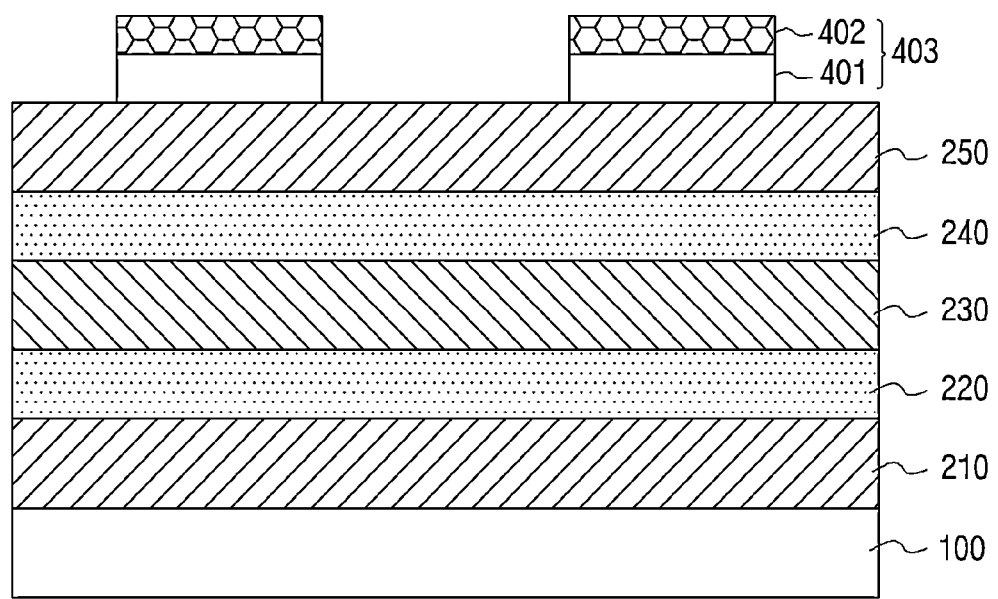

Referring to FIG. 3, a mask layer 403 is formed on the second n-type semiconductor layer 250. The mask layer 403 is composed of an oxide layer 401 and a metal layer 402. The oxide layer 401 may be formed of silicon oxide. Further, although the metal layer 402 can be formed of any metal so long as the metal has etching selectivity with respect to the oxide layer 401, nickel, chromium or titanium is preferred as a material for the metal layer.

The mask layer 403 may be formed in various ways. For example, the metal layer 403 may be formed by a lift-off process that includes forming a photoresist pattern, depositing the oxide layer 401 and the metal layer 402, and removing the photoresist pattern to form a predetermined pattern. Alternatively, the metal layer 403 may be formed by sequentially depositing the oxide layer 401 and the metal layer 402, forming a photoresist pattern thereon, and etching the oxide layer 401 and the metal layer 402 using the photoresist pattern as an etching mask.

Figure 4:
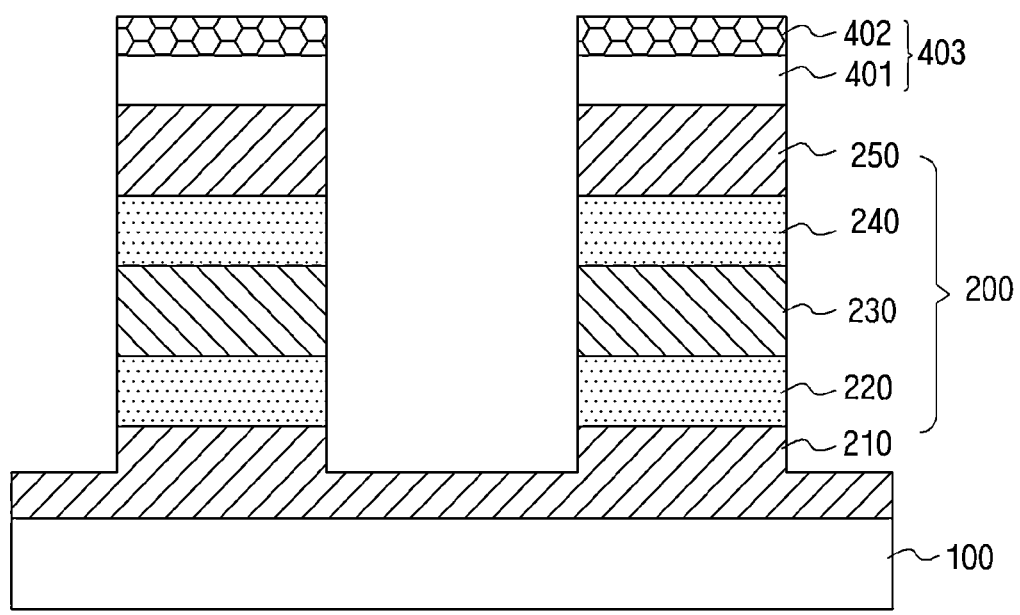

Referring to FIG. 4, etching is performed using the mask layer 403 as an etching mask. Etching may be performed such that the first n-type semiconductor layer 210 placed at a lower portion of the semiconductor structure is partially exposed. Nano-scale or micro-scale light emitting structures 200 are formed by etching. In each of the light emitting structures 200, the surface of the first n-type semiconductor layer 210 is exposed, and side surfaces of the first n-type semiconductor layer 210, the first light emitting layer 220, the p-type semiconductor layer 230, the second light emitting layer 240 and the second n-type semiconductor layer 250 are exposed.

In addition, although not shown, a first n-type electrode may be formed on the exposed surface of the first n-type semiconductor layer 210. The first n-type electrode may be formed by a typical fabrication process of a light emitting diode. For example, the first n-type electrode may be formed by depositing a photoresist, exposing the surface of the first n-type semiconductor layer through the photoresist, and depositing a material for the first n-type electrode. Then, the photoresist is removed to allow the first n-type electrode to remain on the first n-type semiconductor layer 210.

Figure 5:
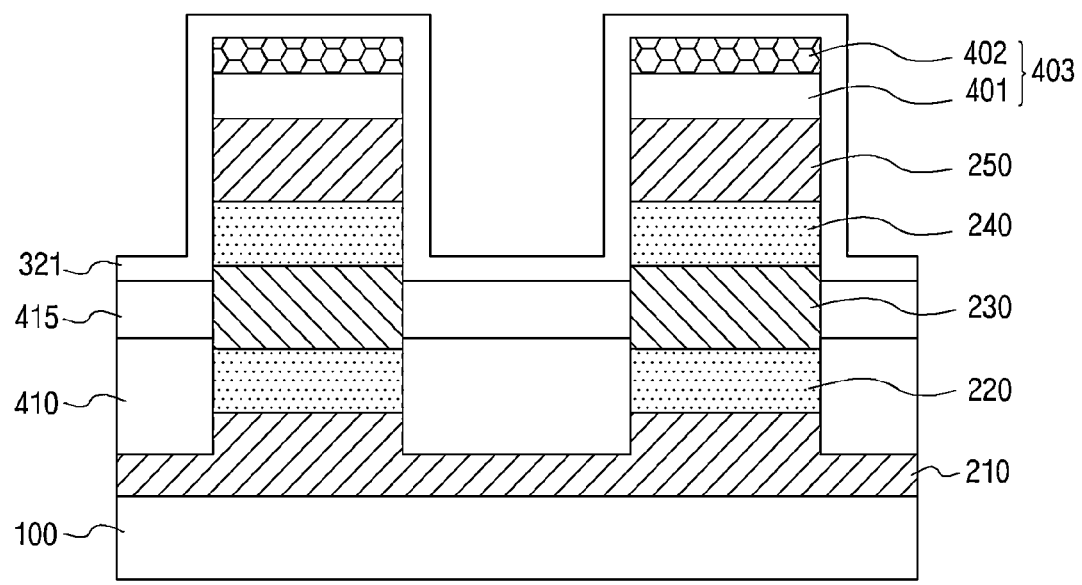

Referring to FIG. 5, a first passivation layer 410 and a sacrificial layer 415 are formed on the structure of FIG. 4. The first passivation layer 410 may be formed of a material permitting a solution process. For example, benzocyclobutene may be used for the first passivation layer 410 due to its low moisture absorbency and thermal stability. If the first n-type electrode is formed on the first n-type semiconductor layer 210 in FIG. 4, the first passivation layer 410 may be formed such that the first n-type electrode is completely buried in the first passivation layer 410.

Further, a material of the sacrificial layer 415 is selected from among materials permitting a solution process and having etching selectivity with respect to the first passivation layer 410. For example, the sacrificial layer 415 may be formed by a solution process using a typical photoresist.

Further, the first passivation layer 410 is formed to fill a space between the light emitting structures 200 while shielding side surfaces of the first n-type semiconductor layer 210 and the first light emitting layer 220. Thus, the first passivation layer 410 is formed to a predetermined region on the side surface of the p-type semiconductor layer 230. In addition, the side surface of the p-type semiconductor layer 230 is partially buried in the sacrificial layer 415 on the first passivation layer 410, and the sacrificial layer 415 is not placed above an uppermost portion of the p-type semiconductor layer 230. Thus, the side surface of the p-type semiconductor layer 230 may be partially exposed from the sacrificial layer 415.

Then, an insulation layer 321 is deposited on the semiconductor structure. The insulation layer 321 may be formed of any material having insulation properties. Thus, silicon oxide permitting a deposition process in a wide range of temperatures may be used as a material for the insulation layer 321. The surface of the sacrificial layer 415 and the exposed surface of the sacrificial layer 415 are covered with the insulation layer 321 by deposition.

Figure 6:
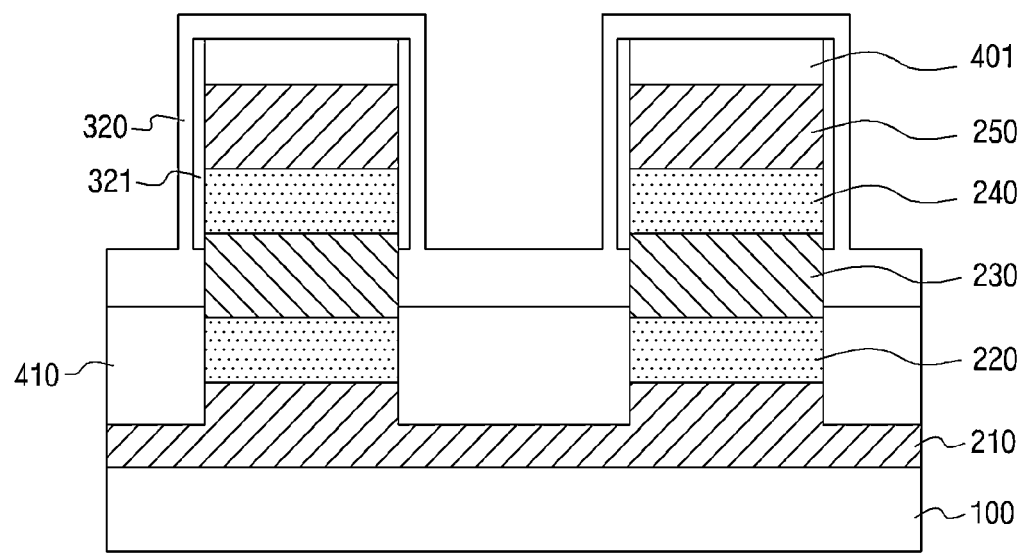

Referring to FIG. 6, overall etching is performed with respect to the structure shown in FIG. 5. For overall etching, anisotropic wet etching may be performed using a hydrofluoric acid-containing solution, that is, HF, a mixture of HF and distilled water, or a buffered oxide etching (BOE) solution as an. The insulation layer 321 on the mask layer 403 and the sacrificial layer 415 is removed by overall etching. In addition, as etching proceeds, the metal layer 402 constituting the mask layer 403 can be removed. As a result, the sacrificial layer 415 covering the oxide layer 401 of the mask layer 403 while filling the space between the light emitting structures 200 is exposed. Accordingly, after overall etching, the insulation layer 321 remains on a portion of the p-type semiconductor layer 230, and on the side surfaces of the second light emitting layer 240, the second n-type semiconductor layer 250 and the oxide layer 401.

Then, the sacrificial layer 415 is removed. Since the sacrificial layer 415 is formed of an organic material, the sacrificial layer 415 can be easily removed using a solvent.

Specifically, the sacrificial layer can be easily removed using a solvent that has etching selectivity with respect to the oxide layer 401 of the mask layer 403 and the first passivation layer 410. As the sacrificial layer 415 is removed, the side surface of the p-type semiconductor layer 230 and the upper surface of the first passivation layer 410 are exposed.

Then, a p-type electrode 320 is formed. The p-type electrode 320 may be formed of Ni/Au. The p-type electrode 320 is formed by a typical deposition process and is formed on an exposed side surface of the insulation layer 321, and on the side surface of the p-type semiconductor layer 230 and the upper surface of the first passivation layer 410, which are exposed by removing the sacrificial layer 415.

Figure 7:
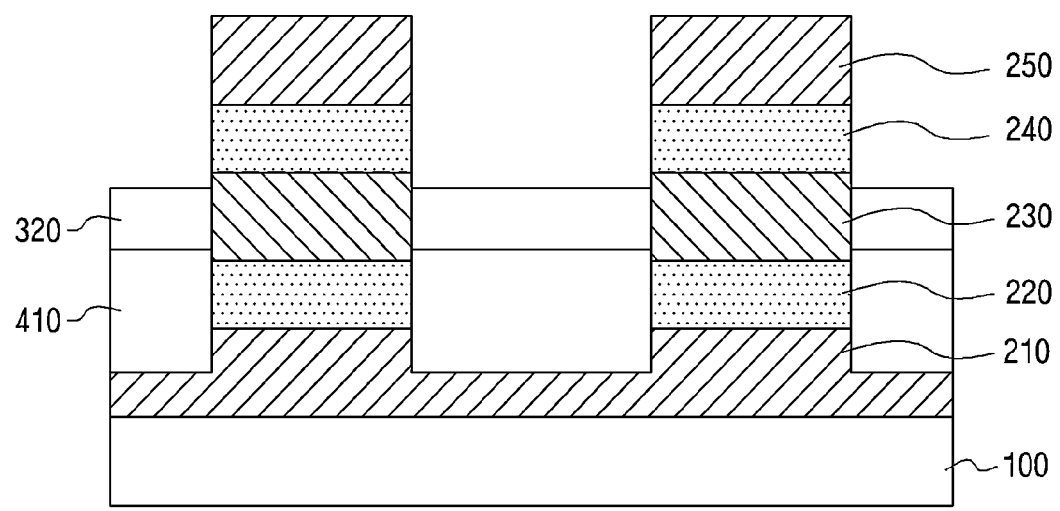

Referring to FIG. 7, the p-type electrode 320 is selectively removed, and the oxide layer 401 and the insulation layer 321 are also removed. As a result, the p-type electrode 320 remains on the first passivation layer 410 while adjoining the p-type semiconductor layer 230.

First, the p-type electrode 320 is subjected to etching. To this end, anisotropic dry etching may be performed. Further, in order to allow the p-type electrode 320 adjoining the side surface of the p-type semiconductor layer 230 to remain, the substrate 100 may be subjected to etching in a slanted state at a predetermined inclination. As a result, the p-type electrode 320 on the upper surface of the oxide layer 401 and on the side surface of the insulation layer 321 can be removed. Then, by removing the remaining oxide layer 401 and the insulation layer 321, the p-type electrode 320 is formed to adjoin the p-type semiconductor layer 230.

Further, when the insulation layer 321 and the oxide layer 401 under the p-type electrode 320 are removed, the p-type electrode 320 on the insulation layer 321 and the oxide layer 401 is removed, and only the p-type electrode 320 on the side surface of the p-type semiconductor layer 230 remains. Removal of the insulation layer 321 and the oxide layer 401 may be achieved by wet etching using an etchant such as HF and the like.

Figure 8:
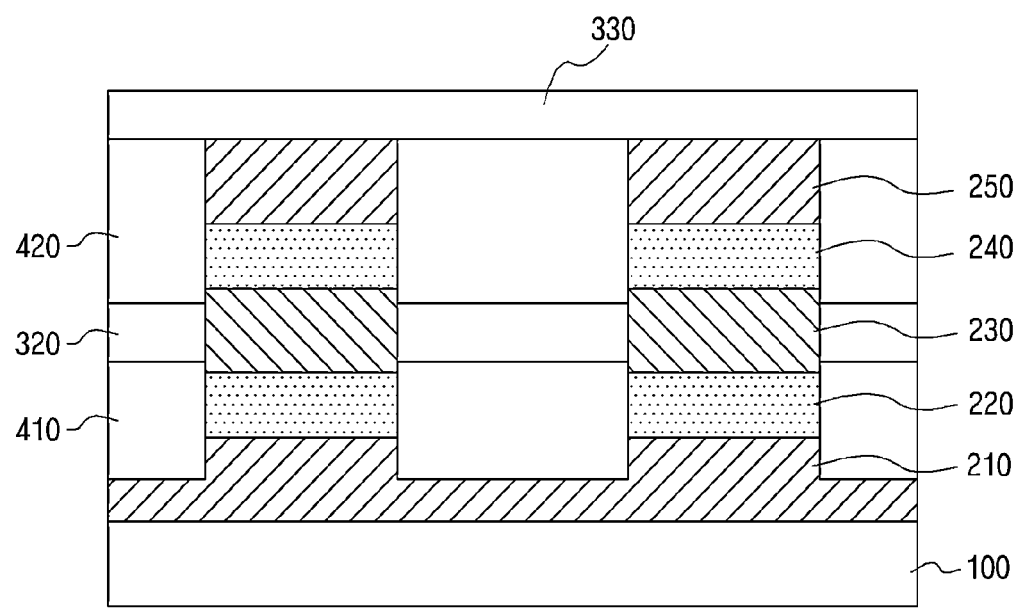

Referring to FIG. 8, a second passivation layer 420 is formed on the structure of FIG. 7. The second passivation layer 420 may be formed of any insulation material permitting a solution process. Thus, the second passivation layer 420 may be formed using spin-on-glass (SOG) and the like. In addition, polymer materials having insulation properties can be used for the second passivation layer 420.

The second passivation layer 420 may be formed to expose an upper or side surface of the second n-type semiconductor layer 250. In addition, a second n-type electrode 330 is formed on an upper surface of the second passivation layer 420 and on an exposed surface of the second n-type semiconductor layer 250. The second n-type electrode 330 may have a structure of Ti/Au or Cr/Au.

Further, the first n-type electrode 310 and the p-type electrode 320 will be exposed through a separate process.

For example, the p-type electrode 320 may be exposed by etching the second passivation layer 420, and the first n-type electrode 310 may be exposed by etching the second passivation layer 420, the p-type electrode 320 and the first passivation layer 410.

In addition, when the first n-type electrode 310 is not formed in FIG. 4, the first n-type electrode 310 may be formed by partially exposing the surface of the first n-type semiconductor layer 210 through selective etching in a process after the process shown in FIG. 8, followed by burying an exposed region with a conductive metal.

According to the present invention as described above, a plurality of column-shaped light emitting structures is formed on the same substrate 100. In addition, each of the light emitting structures 200 is formed on the same first n-type semiconductor layer 210 and includes two light emitting layers 220, 240. Thus, electrical connection between the light emitting structures 200 and the first n-type semiconductor layer 210 can be achieved through at least one first n-type electrode 310, and the p-type semiconductor layers 230 are electrically connected to the p-type electrode 320 formed as a common electrode. In addition, the second n-type semiconductor layer 250 of each of the light emitting structures 200 is electrically connected to a single second n-type electrode 330.

According to the fabrication process, the first light emitting layer 220 and the second light emitting layer 240 may generate different colors. Accordingly, it is possible to realize light of various colors and to achieve efficient formation of the p-type electrode 320 electrically connected to the p-type semiconductor layers 230.

Although the present invention has been described with reference to some embodiments in conjunction with the accompanying drawings, it should be understood that the foregoing embodiments are provided for illustration only and are not to be construed in any way as limiting the present invention, and that various modifications, changes, alterations, and equivalent embodiments can be made by those skilled in the art without departing from the spirit and scope of the invention.

What is claimed is:

1. A light emitting diode comprising:
    a light emitting structure formed on a substrate, and comprising a first n-type semiconductor layer, a first light emitting layer, a p-type semiconductor layer, a second light emitting layer and a second n-type semiconductor layer; a first n-type electrode adjoining the first n-type semiconductor layer at a lower portion of the light emitting structure;
    a second n-type electrode adjoining the second n-type semiconductor layer at an upper portion of the light emitting structure; and
    a p-type electrode adjoining a side surface of the p-type semiconductor layer of the light emitting structure,
    wherein the light emitting structure has the same shape and the same structure as an adjacent light emitting structure formed on the substrate,
    wherein the p-type electrode is formed on a first passivation layer filling a space between the light emitting structure and the adjacent light emitting structure, and
    wherein the p-type electrode is disposed between the light emitting structure and the adjacent light emitting structure.

2. The light emitting diode according to claim 1, wherein the light emitting structure and the adjacent light emitting structure share the first n-type semiconductor layer.

3. The light emitting diode according to claim 1, wherein the second n-type electrode is formed on a second passivation layer formed on the p-type electrode.

4. The light emitting diode according to claim 1, further comprising:
    a second passivation layer disposed between the light emitting structure and the adjacent light emitting structure and on the p-type electrode.

5. The light emitting diode according to claim 1, wherein the second n-type electrode is disposed on top surfaces of the light emitting structure, the adjacent light emitting structure, a second passivation layer disposed on the p-type electrode.

6. A light emitting diode comprising:

a light emitting structure formed on a substrate, and comprising a first n-type semiconductor layer, a first light emitting layer, a p-type semiconductor layer, a second light emitting layer and a second n-type semiconductor layer; a first n-type electrode adjoining the first n-type semiconductor layer at a lower portion of the light emitting structure; a second n-type electrode adjoining the second n-type semiconductor layer at an upper portion of the light emitting structure; a p-type electrode adjoining a side surface of the p-type semiconductor layer of the light emitting structure; and a second passivation layer disposed on the p-type electrode, wherein the light emitting structure has the same shape and the same structure as an adjacent light emitting structure formed on the substrate, wherein the p-type electrode is formed on a first passivation layer filling a space between the light emitting structure and the adjacent light emitting structure, wherein the p-type electrode is disposed between the light emitting structure and the adjacent light emitting structure, wherein the second passivation layer is disposed between the light emitting structure and the adjacent light emitting structure, and wherein the second n-type electrode is disposed on top surfaces of the light emitting structure, the adjacent light emitting structure, and the second passivation layer.

* * * * *